June 20, 1967 H. F. RIETH 3,327,221

UHF REMOTE CONTROL DEVICE

Filed Dec. 20, 1962 3 Sheets-Sheet 1

INVENTOR:
Harold F. Rieth

By Smyth, Roston & Pavitt
Attorneys

UHF REMOTE CONTROL DEVICE

Filed Dec. 20, 1962 3 Sheets-Sheet 2

INVENTOR:
Harold F. Rieth
By Smyth, Roston & Pavitt
Attorneys

June 20, 1967 H. F. RIETH 3,327,221

UHF REMOTE CONTROL DEVICE

Filed Dec. 20, 1962

3 Sheets-Sheet 3

INVENTOR:
Harold F. Rieth

By Smyth, Roston & Pavitt
Attorneys

United States Patent Office 3,327,221

Patented June 20, 1967

3,327,221

UHF REMOTE CONTROL DEVICE

Harold F. Rieth, Pasadena, Calif., assignor to Packard-Bell Electronics Corporation, Los Angeles, Calif., a corporation of California Filed Dec. 20, 1962, Ser. No. 246,055
7 Claims. (Cl. 325—459)

The present invention relates to television receivers and more particularly to new and improved tuning means for tuning television receivers to stations in two different frequency bands.

At the present time television receivers are normally equipped with a tuner having a plurality of resonant circuits that are pre-tuned to the frequencies of the channels it is proposed to receive. In order to tune the receiver to a particular channel the tuner is actuated to place the preselected resonant circuit into an operative condition. The large majority of the television sets commercially sold at the present time have at least a portion of the resonant circuits mounted in a turret that may be rotated to select the particular circuit desired. Since there are only twelve channels available in the VHF, or very high frequency, band it is convenient and practical to employ twelve separate resonant circuits in the tuner whereby the receiver may have a separate pretuned circuit for each of the channels available in the VHF band. However, in the UHF, or ultra high frequency, band there are 70 channels and the frequencies are much higher than those in the VHF band. As a result, it has been necessary to provide additional and separate tuning means for receiving the stations broadcasting on the UHF band. This results in two entirely separate and independent tuning systems. This in turn necessitates two separate control means for selecting the various channels. This makes it confusing and inconvenient to tune the receiver. In addition, if it is desired to employ a remote tuning system, it has been necessary to have a duplication of remote control systems for controlling the two separate tuning systems. Therefore, although the prior tuning means have been effective for tuning the various channels in the UHF and VHF bands, the tuning means have not been entirely satisfactory in that they have limited range and/or are inconvenient.

It is now proposed to provide means for tuning a television set which will overcome the foregoing difficulties. More particularly, it is proposed to provide television tuner means adapted to tune both the VHF and UHF channels from a single control having the same range of positions for each band of frequencies. More particularly, this is to be accomplished by providing a tuner having twelve different positions corresponding to the twelve different channels presently available on the VHF band. A first set of tuning means is provided which includes separate means tuned to each of the channels in the VHF band. In addition, a similar number of sets of tuning means are provided that are tuned to the UHF band. Each of the UHF sets of tuning means is broadly tuned to cover a group of channels. Thus the UHF band will be divided into twelve separate groups. Each of the tuning means also includes means which are fine tuned to a preselected channel in the group. It may thus be seen that the UHF and VHF portions of the tuner have the identical number of tuning positions and a single control of either the manual or remote variety may be employed to tune both portions of the tuner.

These and other features and advantages of the present invention will become readily apparent to persons skilled in the art from reading the following detailed description of a limited number of embodiments thereof, particularly when taken in connection with the accompanying drawings wherein like reference numerals refer to like parts and wherein.

Figure 1:
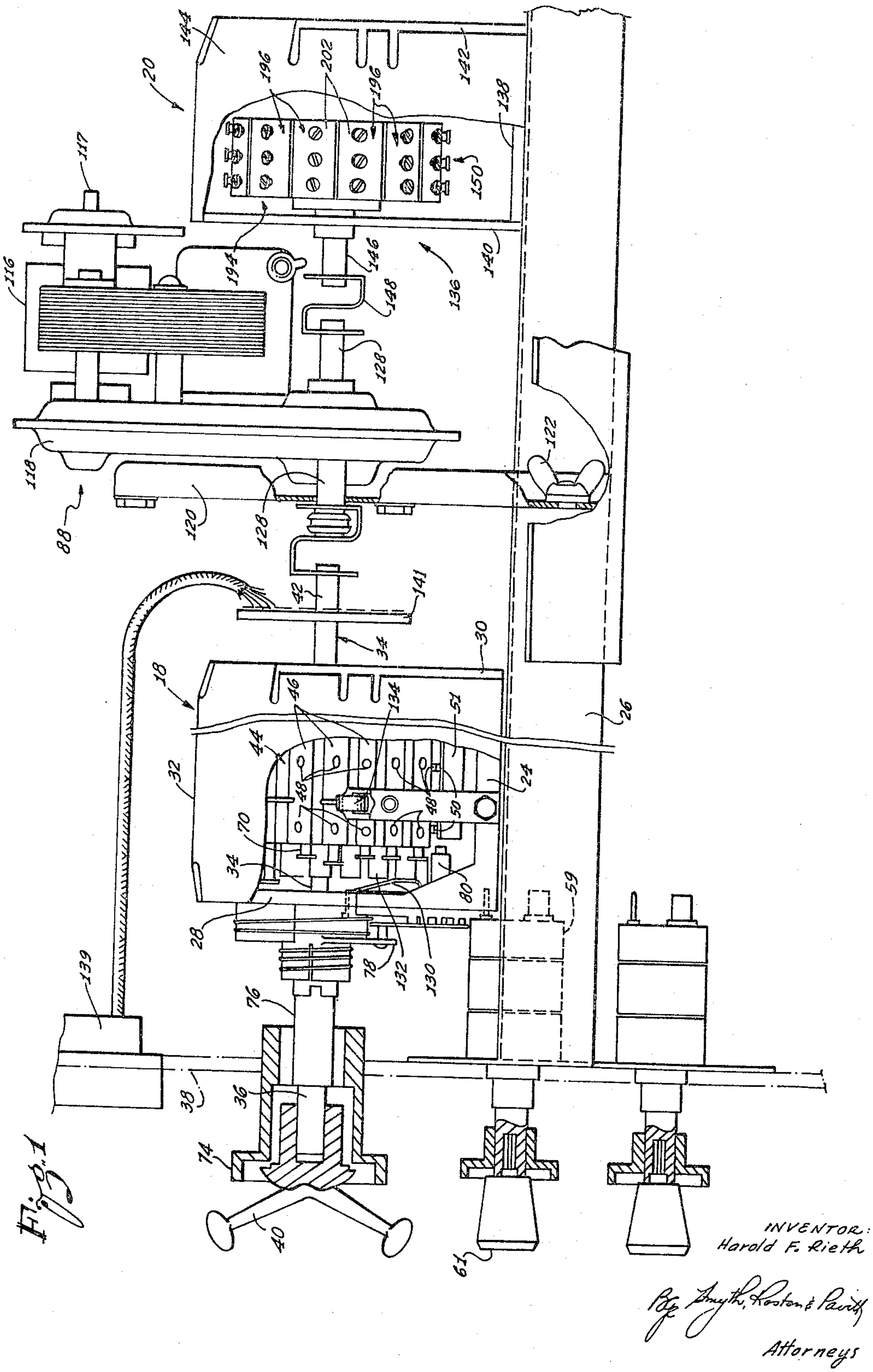
FIGURE 1 is a side view, with portions thereof being broken away, of a television tuning system embodying the present invention.

Referring to the drawings in more detail, the present invention is particularly adapted to be embodied in a television receiver 10 (FIGURE 2) which may be connected to one or more antennas 12 and 14 for receiving electromagnetic signals and producing a video picture on a picture tube 16. The input to the present television receiver 10 includes a first tuner 18 connected to the first antenna 12 and adapted to be tuned to the frequencies of the various stations or channels in the VHF or very high frequency range. A second tuner 20 is also provided that may be connected to the second antenna 14 for being tuned to the frequencies of the various stations or channels in the UHF or ultra high frequency range.

The first or VHF tuner 18 which in the present instance is of the so-called turret type includes a frame having a base 24 (FIGURE 1) that is secured to one of the chassis 26 in a television receiver 10. The frame also includes a pair of end members 28 and 30 that project upwardly from the opposite ends of the base 24 so that a cover 32 may be secured to the end members 28 and 30 and form an enclosed space.

A pair of aligned openings may be provided in each of the end members 28 and 30 for rotatably supporting a shaft 34 that extends transversely of the space inside of the cover 32. The shaft 34 may be much longer than the base 24 so that the ends will project beyond the end members 28 and 30. The front end 36 of the shaft 34 extends beyond a control panel 38 for the receiver 10 and has a control knob 40 secured thereto. Thus an operator standing adjacent the control panel 38 may manually rotate the tuner shaft 34. The rear end 42 of the shaft 34 extends beyond the rear end member 30.

A plurality of tuning means 44 may be secured to the shaft 34 by brackets (not shown). Each of the tuning means 44 includes a rigid support member 46 that has the opposite ends thereof secured to the brackets. The support members 46 are thus disposed substantially parallel to each other and to the shaft 34 in a generally cylindrical array.

The tuning means 44 on the rigid support members 46 may include a set of coils that are disposed on the inside of the members 46 and are interconnected with electrical contacts 48 that are exposed from the outsides of the rigid members 46. These contacts 48 are adapted to engage a set of complementary contacts 50 on a fixed member 51. The contacts 50 on the member 51 are in turn electrically interconnected with various portions of a local oscillator 52 (FIGURE 2), a mixer and to the antenna 12. Thus by rotating the shaft 34 any preselected support member 46 may be positioned so that the contacts 48 thereon will engage the contacts 50. Thus the coil means on the support member will be operatively interconnected with the receiver and will cause the receiver to be tuned to the station corresponding to the selection made by the operator.

In the present instance the tuner 18 is adapted to be employed for tuning stations in the VHF or very high frequency band. At the present time the VHF band includes twelve separate channels. Accordingly the tuner 18 may include twelve separate tuning means 44, i.e. one tuning means for each channel. These tuning means 44 may be disposed at equally spaced increments of 30° around the cylindrical array. Thus by turning the shaft 34 through a 30° arc the contacts 48 on an adjacent tuning means 44 will be interconnected with the contacts 50.

Each of the tuning means 44 may include one or more coils that may form at least parts of a resonant circuit for being connected to the antenna 12, the oscillator 52 and/or a mixer 54. The antenna resonant circuit that is interconnected with the antenna by engagement of its contacts 48 with the contacts 50 will be tuned to cover a band of frequencies that includes substantially only those frequencies containing signals from the particular station or channel to be received. In the VHF band, the pass band of the antenna means may be on the order of 6 megacycles wide so as to pass both the video and audio signals.

The resonant circuit in the tuning means for the local oscillator 52 will be interconnected with the contacts 50 leading to the oscillator. This resonant circuit may thus form a part of a tank circuit that controls the frequency of the oscillator. The oscillator 52 may be tuned to oscillate at a frequency which is displaced from the channel frequency by a predetermined amount. The difference may be equal to the intermediate frequency of the receiver. Thus, irrespective of which tuning means 44 is connected to the contacts 50, the frequency of the local oscillator will always be displaced from the frequency of the received station or channel by a fixed amount.

The station or channel signal in the antenna section and the signal from the local oscillator may be coupled to a pair of inputs to a mixer 54. The mixer 54 may be effective to mix or heterodyne these two signals and thereby produce a signal at the output 56 having a frequency that is equal to the difference between the two input signals. Since the tuning means 44 are tuned so that this difference is constant, the frequency at the output 56 will always be the same.

The output 56 may be connected to one bank **55*a* of a selector switch 55 that leads to the input of a so-called intermediate frequency or IF amplifier 58 in the video position 51 of the receiver and to a second bank 55*b* that leads to the input of intermediate frequency amplifier and detector 53 in the audio portion 55 of the receiver. The amplifier 58 will be effective to amplify the video portion of the intermediate frequency signal to a more useful level and separate out various portions of the signal at the outputs. The amplifier 58 may have its outputs connected to a horizontal control 60, a vertical control 62 and a video control 64. The outputs of these controls 60, 62 and 64 are, in turn, connected to the various control electrodes in the picture tube 16. The various portions of the video signal will thus be fed from the amplifier 58 through the controls 60, 62 and 64 to the picture tube 16** and be effective to produce a visual picture thereon.

The amplifier and detector 53 will be effective to amplify the audio portion of the intermediate frequency signal and detect that portion to provide an audio signal to accompany the picture. The output of the amplifier-detector 53 is interconnected with an audio volume control 57 that is effective to regulate the volume of the audio signal at its output. This control may be of any variety suitable for controlling the volume of an audio signal passing therethrough. For example, it may be similar to the volume control means disclosed and claimed in copending application Ser. No. 148,118, filed Oct. 27, 1961, in the names of Fred M. Hayden and Orris K. Paddock and assigned of record to Packard-Bell Electronics Corporation. More particularly, this volume control 57 may include a potentiometer 59 (FIGURE 1) that may be manually adjusted by a control knob 61 by rotating in one direction to decrease the volume and in the opposite direction to increase the volume. In addition, a second potentiometer may be included in the control 58. This potentiometer may be electrically operated by a relay or similar device to increase the volume in response to a pulse on the input 63 and to decrease it in response to a pulse on the input 65. The output from the volume control 57 is connected to a first stage 67 of audio amplification, a stage 69 of audio power amplification, and a loudspeaker 71.

Each of the tuning means 44 may include a fine tuning screw 70 that projects from the front mounting bracket. This screw may form a part of the core for one or more coil means. Thus the axial position of the screw will control the inductance of the coil and therefore the resonant frequency of the circuit. A head may be provided in a conventional manner on the end of the screw 70 for turning the screw. A fine tuning control knob 74 may be mounted on the end of an outer shaft 76 disposed concentrically about the shaft 34. A reaction member 78 may be frictionally secured to the shaft 76 to rotate therewith and move a gear train 80 into engagement with the head of the fine tuning screw 70 on the coil means 44 adjacent the member 51. Further rotation of shaft 76 will cause the screw 70 to rotate and thereby fine tune the coil means 44 to the exact frequency.

The foregoing television receiver 10 may be adjusted by the operator manually turning the various control knobs projecting from the control panel 38. However, in order to do so, it is necessary for the operator to be within reach of the receiver. Accordingly, it may be desirable to provide a remote control system whereby the receiver may be adjusted by an operator while he is located at a normal viewing location even though this may be a substantial distance from the receiver 10.

The present remote control system includes a remote control transmitter 84 (FIGURE 2) that may be carried by the operator and a remote control receiver 86. The remote control transmitter 84 may be adapted to be held in the operator's hand for radiating control or command signals to the receiver 86. The transmitter may include a housing having one or more control elements 90 for permitting adjustment of the volume of the sound and one or more control elements 92 for permitting adjustment of the channel or station. In addition, if it is so desired, other control elements may be provided for permitting further remote control functions to be performed.

When the operator manipulates the controls 90 and 92, it will cause an appropriate signal to be radiated. Although this signal can be of any desired variety, it has been found convenient to employ ultrasonic energy in a frequency range of about 30 or 40 kilocycles. More particularly, this may be accomplished by providing a plurality of tuning rods or similar devices that will vibrate at predetermined ultrasonic frequencies. Thus, if the volume control 90 is moved in one direction, it will cause one tuning rod to be struck and radiate a command signal that is a short burst of ultrasonic energy of a first frequency for increasing the volume of the sound and, if it is moved in the opposite direction, it will cause a second tuning rod to be struck and radiate a command signal that is a short burst of energy of a second frequency for decreasing the volume of the sound. Similarly, the station or channel selector control 92 may be moved in one direction to cause a third tuning rod to radiate a command signal that is a short signal of a third frequency for increasing the frequency of the station being received and, when it is moved in the opposite direction, it will excite a second tuning rod into radiating a command signal of a fourth frequency for decreasing the frequency of the station being received.

The remote control receiver 86 is mounted in the television receiver 10 on one of the chassis. The present receiver 86 includes circuitry for receiving the command signal and an electric drive motor means 88 (FIGURE 1) that is electrically interconnected therewith. The remote control receiver 86 may be mounted on its own chassis so as to be a self-contained unit that may be installed at the time the receiver 10 is originally manufactured or subsequently added with no difficulty.

The input to the receiver 86 includes a transducer 94 for sensing command signals. Although the command signals for controlling the receiver may be of any suitable variety, in the present instance, they may be of the so-called ultrasonic signals having frequencies in the range of about 30 to 40 kilocycles per second. Accordingly, the transducer 94 may be a device such as a microphone capable of receiving ultrasonic command signals radiated from the transmitter 84.

When the transducer 94 is subjected to a command signal from the transmitter 84, it will produce an electrical signal that will be a current pulse having a frequency and time duration substantially identical to the command signal. The transducer 94 is interconnected with the input to an amplifier 96 that will be effective to amplify the current to a more useful level. The output of the amplifier 96 may be interconnected with the input to filter means 98. The filter means 98 may include a plurality of outputs 100, 102, 103, 104, 105 and 106, and bandpass means for each of these outputs 100, 102, 103, 104, 105 and 106. Each of the bandpass frequencies may be equal to the frequency of one of the command signals radiated from the transmitter 84 so that each output will respond to only one frequency The outputs 100 and 102 are connected to the means for passing the frequencies corresponding to the frequencies of the signals for increasing and decreasing the volume. The outputs 100 and 102 may be respectively interconnected with the input to a first amplifier and detector 108 and second amplifier and detector 110 respectively. Each of these amplifiers-detectors will be effective to detect and amplify the signals from the outputs 100 and 102 and produce DC pulses corresponding thereto. The output of the amplifier-detector 108 may be connected to the input 63 of the volume control 57. Thus each pulse from the amplifier-detector 108 will be effective to cause the volume of the signal from the volume control 57 to be increased. Similarly, the output from the amplifier-detector 110 may be connected to the input 65 to the volume control 57. Thus, each pulse from the amplifier-detector 110 will be effective to cause the volume of the signal from the volume control 57 to be decreased.

The output 103 may be connected to the input of an amplifier-detector 109. The amplifier-detector 109 is effective to energize a relay 109*a* that will alternately move the switch 55 between its two extreme positions whenever the control 90 in the transmitter 84 is manipulated.

The outputs 104 and 106 are connected to the bandpass means for passing the frequencies corresponding to the frequencies of the command signals for increasing and decreasing the frequency of the station or channel being received. The output 104 is connected to an input of an amplifier-detector 112 while the output 106 is connected to an input of an amplifier-detector 114. These amplifier-detectors 112 and 114 are similar to the amplifier-detectors 108 and 110 and are respectively effective to detect and amplify the signals from the outputs 104 and 106 to thereby produce DC pulses. The outputs of the two amplifier-detectors 112 and 114 may be interconnected with the drive motor means 88.

Although the drive motor means 88 may be of any suitable variety, in the present instance, it includes a reversible electric motor 116. The motor 116 is supported by a housing 118 which encloses a reduction gear train and is attached to the chassis 26 by means of a mounting bracket 120. In order to facilitate installing the drive motor means 88 at the time the receiver 10 is originally manufactured or at a later date, the mounting bracket may be secured in position by fastening means such as bolts and wing nuts 122.

The motor 116 may be of the so-called split phase variety wherein a power or primary winding is provided that encompasses the entire stator. In addition, a forward winding interconnected with the input 124 encompasses only a portion of the stator, while a reverse winding interconnected with the input 126 encompasses only another portion of the stator.

The rotor of the motor 116 is mounted on a shaft 117 that has a gear thereon for meshing with the gear train in the housing 118. The rotor shaft 117 may be spring biased toward an unclutched position so that when the motor 116 is de-energized, the shaft will be disconnected from the gear train. However, when the windings of the motor 116 are energized, the shaft 117 will be magnetically biased axially thereof so that the gear thereon will move into a clutched position and be connected to the gear train. The gear train includes an output shaft 128 which extends from the opposite sides of the housing in substantial alignment with the shaft 34. The ends of the two shafts 34 and 128 are spaced from each other but are connected together by a coupling. Thus, both of the shafts will rotate together.

It may thus be seen that if the operator actuates the transmitter 84 so that the transducer 94 receives a command signal, a pulse will pass through the amplifier 96 to the filter 98. Depending upon the froquency of this pulse, it will pass from the outputs 100 or 102 to the amplifer-detectors 108 or 110 to increase or decrease the volume of the audio signal, or it will pass from the outputs 104 or 106 to the amplifier-detectors 112 or 114 so as to energize the forward or reverse windings in the motor 116. This will cause the rotor to move into clutching position and drive the gear train in the housing 118 in the forward or reverse directions. The shaft 128 will then rotate and carry with it the shaft 34 whereby the tuning means 44 will be rotated.

In order to insure the motor 116 remaining energized sufficiently long to drive the turret and tuning means 44 thereon to the next succeeding position, a switch 130 (FIGURE 1) may be provided on the front end member 28. This switch is positioned to be engaged by detents or projections 132 on the front mounting bracket of the turret. Thus, as soon as the turret begins to rotate, a detent or projection 132 will engage and close the switch 130. Closing of this switch 130 will retain the motor energized and cause it to continue to run until the projection 132 passes under the switch 130 and allows it to open. When this occurs the turret will have rotated far enough for the next tuning means 44 to be indexed into operative position. When the switch 130 opens the motor 116 will de-energize and the turret will stop rotating. A spring biased detent 134 may be provided for insuring that the turret stops in position for the contacts 48 to be in engagement with the contacts 50 whereby the tuner 18 and oscillator 52 are tuned to the desired station.

If desired, a suitable indicating means may be provided to facilitate the operator observing the position of the tuner and the channel to which the receiver is tuned. In the present instance, this means includes an indicator 139 mounted on the panel 38 adjacent the selector knob 40. This indicator 139 includes a separate indicia for each channel in the VHF region. For example, the indicia may be the numbers 2 to 13 corresponding to the numbers of the channels. Individual lamps may be provided behind each of the indicia so that the energizing of one lamp may illuminate the indicia. A switch may be mounted on the shaft 34 so as to be actuated by the rotation of the shaft 34. This switch includes a rotor and a separate pole for each lamp while the rotor is connected to a power supply. Each of the poles may be connected to one side of a lamp. The opposite sides of the lamps may be connected to one of the contacts in the bank 55*c* of the selector switch 55. Thus, as the shaft 34 rotates to tune the receiver, the rotor in the switch will also move and turn on the particular lamp corresponding to the channel that has been selected.

The second or UHF tuner 20 may be provided for tuning the receiver 10 for receiving stations broadcasting on the channels in the ultra-high frequency band. This tuner 20 may be generally similar to the first tuner 18. The present tuner 20 includes a frame 136 (FIGURE 1) havin a base 138 for being secured to the chassis 26 in the receiver 10. The frame 136 includes a pair of end members 140 and 142 that project upwardly from the base 138. A cover 144 may be secured over the end members 140 and 142 so as to form an enclosed space.

A pair of aligned openings may be provided in each of the end members 140 and 142 for rotatably supporting a shaft 146. The shaft 146 may include a portion that extends from the front end of the frame 136 so as to be in substantial alignment with the shafts 34 and 128. A flexible coupling 148 may be provided that interconnects the adjacent ends of the two shafts 128 and 146. It may thus be seen that all three shafts 34, 128 and 146 will be interconnected so as to rotate together as a result of an operator manually turning the control knob 40 or the motor 116 being energized.

The shaft 146 extends axially of the housing and may have a cylinder 150 secured thereto. The cylinder 150 is substantially concentric with the shaft 146 and is rigidly secured thereto such that rotation of the shaft 146 will also rotate the cylinder 150. The cylinder 150 may have ultra-high frequency or UHF local oscillator 152 (FIGURES 2 and 4) disposed therein. This oscillator 152 may be of any desired variety capable of oscillating at the required frequencies and with the required stability. In the present embodiment, the oscillator 152 is of a hybrid variety. It is desirable for the oscillator 152 to be sufficiently maintained to be capable of having at least a portion thereof disposed inside of the cylinder 150, which is electrically grounded.

The oscillator 152 may include amplifying means such as a solid state device or a vacuum tube. In the present instance, a vacuum tube 154 (FIGURE 4) of the miniaturized type is employed. The tube 154 has the heater 156 connected to ground by an inductance 158 and to a source of heater current by an inductance 160 and a lead 162 that extends out of the cylinder 150. The cathode 164 is connected to ground by an inductance 166 and the control grid 168 is grounded by means of resistance 169 and capacitance 170. The plate 172 is connected to a source of B+ voltage by a lead 174 that extends from the cylinder 150 to the power supply section in the receiver 10. The frequency at which this oscillator 152 oscillates may be controlled by means of a resonant tank circuit 179 that is connected between the control grid 168 and ground. A portion 181 of this tank 179 may be disposed in the cylinder 150 adjacent the tube 154 while the remaining portion 183 is disposed outside of the cylinder 150. In order to facilitate the interconnection of both portions of the tank circuit, an electrically conductive path 176 may be provided that extends from the grid 168 to an electrical contact 178 on the exterior of the cylinder 150.

Figures 2, 5:
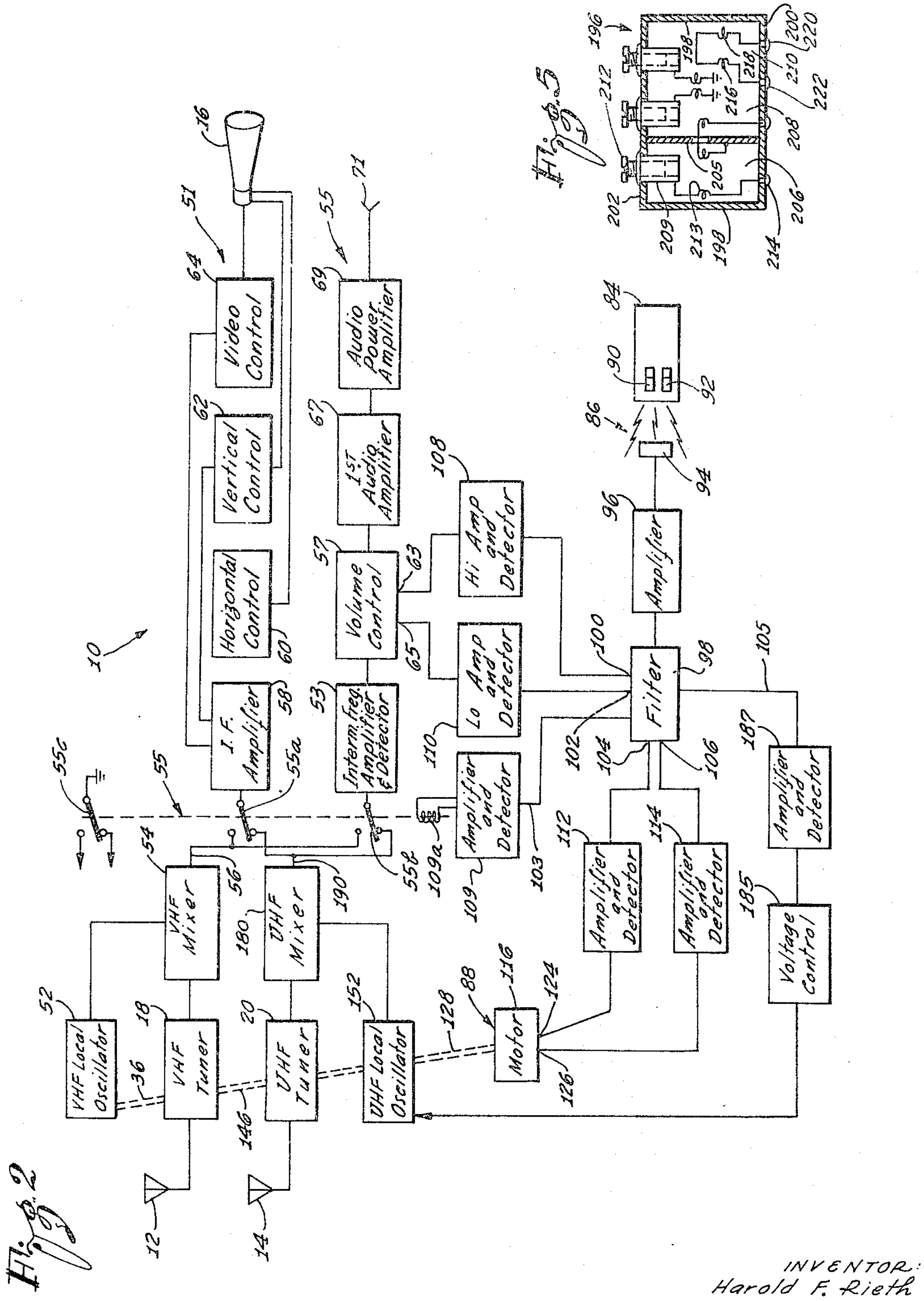
FIGURE 2 is a block diagram of a television receiver employing the tuning means of FIGURE 1.
FIGURE 5 is a fragmentary transverse cross-sectional view taken substantially in the plane of line 5—5 of FIGURE 3.

The portion 181 may include a device that has a reactance that may be varied by changing the voltage applied thereto. For example, it may be desirable to employ a so-called Vericap 181*a* that is the equivalent of an inductance and a capacitance wherein the capacitance will vary in response to the magnitude of a potential applied thereacross. The Vericap 181*a* may be connected to ground by a capacitance 181*b* and to the output of a variable voltage control 185 (FIGURE 2). It may thus be seen that the portion 181 may have a resonant frequency that is dependent upon the voltage from the output of the voltage supply 185.

The input to the voltage supply 185 may be connected to the output of an amplifier-detector 187. The amplifier-detector 187 is, in turn, connected to the output 105 of the filter 98. Each time a pulse appears at the output 105 as a result of manipulating a particular control in the transmitter 84, a signal will pass through the amplifier-detector 187 and produce an output signal. This output signal will be effective to cause the potential from the particular control to vary. The particular control may be of any suitable variety. For example, it may include a relay that will vary a potentiometer each time a signal is received from the amplifier-detector 187.

Figure 4:
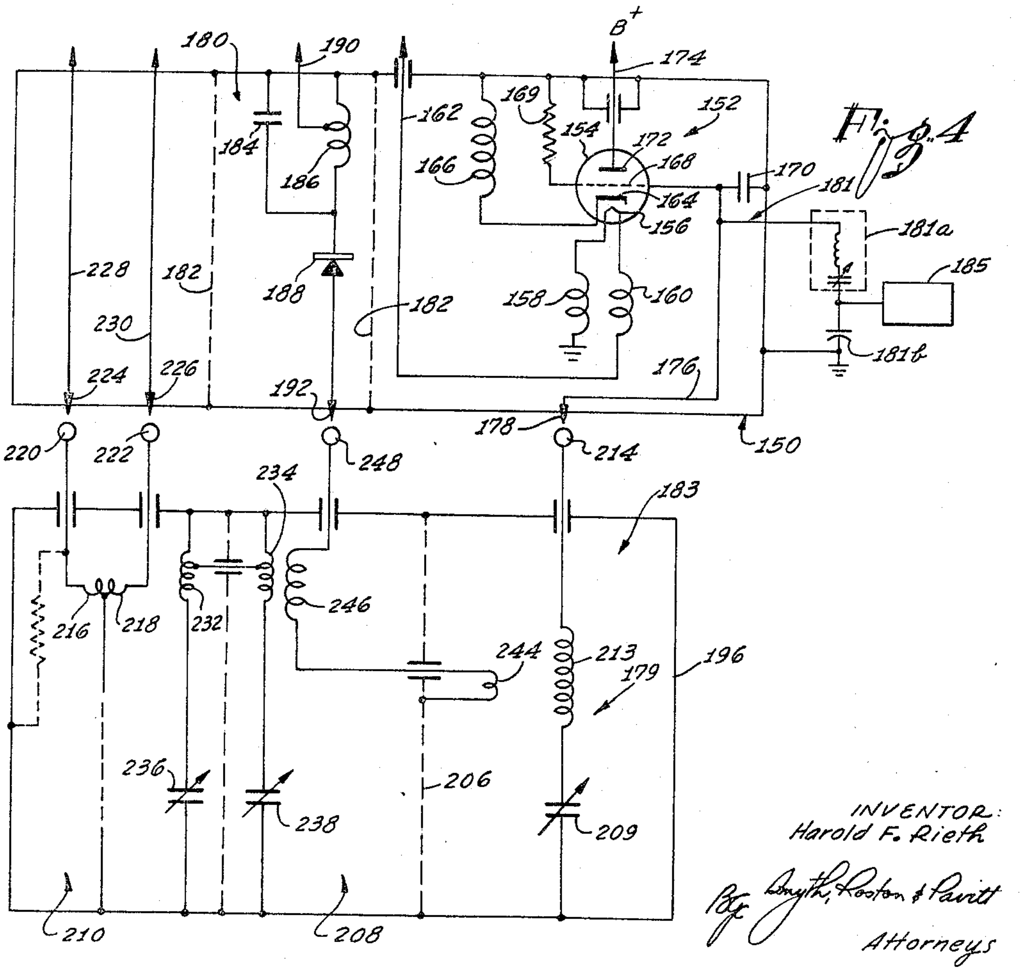
FIGURE 4 is a wiring diagram of a portion of the tuning means of FIGURE 1.

A mixer 180 (FIGURES 2 and 4) may be provided that functions in a manner similar to that of the VHF mixer 54. This mixer 180 may be disposed in the cylinder 150 near the oscillator 152 but isolated therefrom by means of shielding 182 (FIGURE 4). The mixer 180 includes a capacitance 184 and inductance 186 that are connected in parallel to each other and in series with a mixer crystal 188. The inductance 186 has a center tap that is connected to a lead 190 (FIGURES 2 and 4) for being interconnected with the intermediate frequency amplifier 58 and to the audio IF and detector stage 53. The mixer crystal 188 may be connected to a contact 192 on the outside of the cylinder 150.

A plurality of tuning means 194 (FIGURE 1) may be provided for operatively interconnecting the oscillator 152 and mixer 180 with the antenna 14 for selecting the desired station. The present tuning means 194 are disposed around the cylinder 150 in a substantially cylindrical array. Each of the tuning means 194 may be disposed in a housing 196 having a wedge-shaped transverse cross-section. More particularly, each housing 196 includes a pair of end walls 198, an inner wall 200, an outer wall 202, and at least one side wall. Each of the housings 196 may be substantially identical and shaped such that they may be disposed about the cylinder 150 at equally spaced intervals. The housing walls of the housing are preferably of a material that will electrically and magnetically shield the tuning means 194 from each other.

The space inside of the housing 196 includes the oscillator portion 183, a mixer portion 208, and an antenna portion 210. The oscillator portion 183 may be adjacent one of the end walls 198 and separated from the other portions by suitable electric and magnetic shielding such as partitions 205. A variable capacitance 209 (FIGURE 4) may be mounted on the outer wall 202 so as to be disposed inside of the portion 183. The capacitance 209 may have a tuning screw 212 (FIGURE 5) that projects through the end wall 202 so that the capacitance can be varied. An inductance 213 (FIGURE 4) may be connected between the capacitance 209 and an electrical montact 214 that projects from the inner wall 200. This contact 214 is located to engage the contact 178 when the tuning means 194 is properly positioned with respect to the cylinder 150. It may thus be seen that the two portions 181 and 183 will be interconnected with each other and electrically disposed between the control grid 168 and ground. As a consequence, by adjusting the tuning screw 212, the resonant frequency of the tank circuit 179 and therefore the frequency of the oscillator may be tuned throughout a predetermined frequency range. Also, by varying the potential from the voltage source 185, the capacitance of the Vericap 181*a* may be varied to further tune the oscillator 152.

The antenna portion 210 may include one or more antenna coils 216 and 218 that are interconnected with each other and with a pair of contacts 220 and 222 located on the wall 200. These contacts 220 and 222 are positioned to electrically contact a complementary pair of contacts 224 and 226 on the exterior of the cylinder 150. The contacts 224 and 226 may be connected to a pair of conductors 228 and 230 that extend through the cylinder 150 to the UHF antenna 14 so as to carry the UHF signals thereon. In addition, a second pair of coils 232 and 234 may be provided. These coils 232 and 234 are connected to a pair of condensers 236 and 238 so as to form a pair of parallel resonant circuits that are arranged to form a bandpass filter. The coils 232 and 234 may be positioned sufficiently close to each other to be magnetically coupled to each other. Thus, the antenna signals will circulate in the resonant circuits. The two condensers 236 and 238 may include tuning screws that project from the top of the housing 196 and are effective to control the capacities of the condensers. As will become apparent subsequently, the two tuning screws may be adjusted so that the resonant frequencies of the two resonant circuits are slightly different frequencies whereby a band of frequencies may be passed.

The mixer portion 208 includes a first coil 244 and a second coil 246 that are connected in series with each other. The first coil 244 is positioned adjacent the inductance 213 in the oscillator portion 206. Thus, a portion of the energy in the oscillator 152 will be coupled into the coil 244 in the mixer section 208. The second coil 246 is connected in series with the coil 244 and a contact 248 on the wall 200. This coil 246 may be positioned adjacent to one or more of the antenna coils 216 and 218 and/or the coils 232 and 234. This coil 246 will thus have signals therein having frequencies that are within the band of frequencies passed by the filter. The contact 248 is positioned for engaging the contact 192 on the cylinder 150.

It may thus been seen that the UHF signals received by the antenna 14 and within the filter pass band and the signals from the oscillator 152 will be present at the contact 192. These two signals will then circulate through the crystal 188 and the condenser 184 and the inductance 186 where they will be heterodyned to thereby produce sum and difference signals. One of these signals, for example, the difference signal, will be equal to the intermediate frequency. This signal will be present on the lead 190 and may be fed into the amplifier 58.

The portion of the UHF or ultra-high frequency band assigned for the transmission of television programs has been divided into a total of 70 channels with each channel being approximately 6 megacycles wide. Although each and every one of these channels may be employed for the transmission of television programs, in any given area not all of the channels will be employed. More particularly, the frequencies of the various channels are assigned so that two stations transmitting on the same frequencies will be separated by a sufficient distance to prevent overlapping of their radiation patterns and thereby prevent any receivers being capable of simultaneously receiving both stations. Also, it is desirable for stations that have overlapping patterns to be assigned channels having substantially different frequencies. This will prevent "crosstalk" between the two stations and facilitate receivers being able to discriminate between stations. Thus, although there are 70 possible channels, any given receiver will normally be able to receive transmissions on a small portion of this number. More particularly, in even a crowded area, the channels upon which transmission may be received will generally be limited to 12 or less channels. Accordingly, the 70 channels in the UHF band may be arbitrarily divided into 12 separate groups such that normally there will never be more than one station transmitting in any group. Accordingly, even if the UHF tuner 20 is provided with only 12 separate tuning means 194, i.e., a separate tuning means for each of the groups, the tuner 20 will normally be capable of being tuned to all of the stations that are transmitting in the area of the receiver.

As a result, the present tuner 20 has only twelve sets of tuning means 194. Since this is identical to the number of tuning means 44 in the the VHF tuner 18, the tuning means 194 may be arranged in substantially the same configuration as the tuning means 44. Accordingly, the tuning means 44 and 194 are so positioned that whenever the shaft 34 interconnects one of the tuning means 44 with the contacts 50, the shaft 146 will also be properly positioned for interconnecting a corresponding tuning means 194 with the contacts 178.

As previously stated, the coils 232–234 and condensers 236–238 form a pair of parallel resonant circuits which will act as a bandpass filter. Each of these resonant circuits in each of the tuning means 194 may be tuned to approximately the frequencies of the channels forming the group for that tuning means 194. As a consequence, the filter will have a pass band that includes all of the channels in the group. Thus, the frequencies received by the antenna that can reach the contact 248 will only be the frequencies within the group. As previously stated, normally there will be only one station transmitting in any given group.

In addition to the station signal, the oscillator signal will be present at the contact 248. The inductance 213 and particularly the condenser 209 may adjust the frequency of the oscillator 152 so that its frequency differs from the particular station in the group by an amount equal to the intermediate frequency.

By manipulating the transmitter 84, a signal may be transmitted that will produce a signal at the output 105. This signal will then pass through the amplifier and detector to the voltage control 185. This will vary the voltage from the output of the control 185 so as to change the capacitance of the Vericap 181*a*. The amount of this change may be limited to small amounts so as to supplement the capacitor 209 and thereby provide fine tuning. Alternatively, the amount of change may be larger so as to permit tuning the oscillator through a sufficient range to permit tuning to any channel in the group.

The station signal and the oscillator signal may then flow from the contact 248 through the contact 192 to the crystal 188. The oscillator and the station signals will then be heterodyned to produce one or more beat frequency signals. The beat frequency signal produced from the station that it is desired to receive will have a frequency equal to the intermediate frequency. This signal will be the only one that can pass along the conductor 190 to the amplifier 58 so as to be amplified and actuate the remainder of the receiver. As a consequence, although each of the tuning means 194 may be tuned to cover a group of channels, the oscillator 152 may be tuned to select a single channel at the output lead 190.

It may thus be seen that by manipulating the control knob 40 or the transmitter 84, it is possible to simultaneously select tuning means 44 in the VHF tuner 18 and tuning means 194 in the VHF tuner 20. Thus, depending on the setting of the selector switch, it is possible to employ the same control to receive any desired UHF or VHF station transmitting in the area of the receiver 10. The panel 139 may include a plurality of separate indicia for each of the groups of channels in the VHF range. Each indicia may have a separate lamp that is interconnected with the switches 55 and 141 so as to indicate which group is being received.

Figure 6:
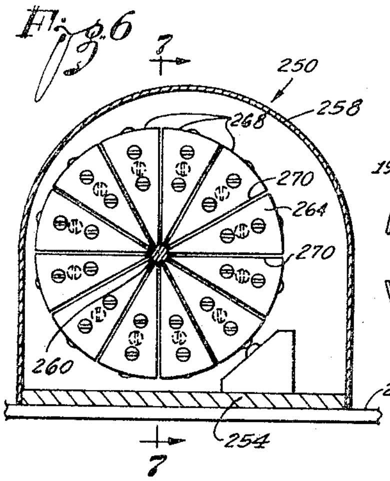
FIGURE 6 is an end view of a portion of a tuner embodying another form of the invention.
Figure 3:
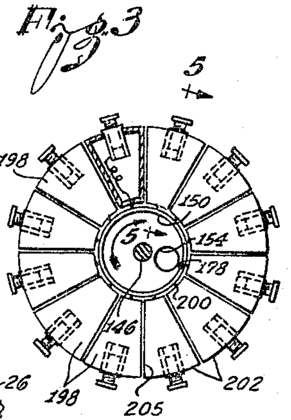
FIGURE 3 is a transverse cross-sectional view of a portion of the tuner means of FIGURE 1 taken substantially in the plane of line 3—3.
Figure 7:
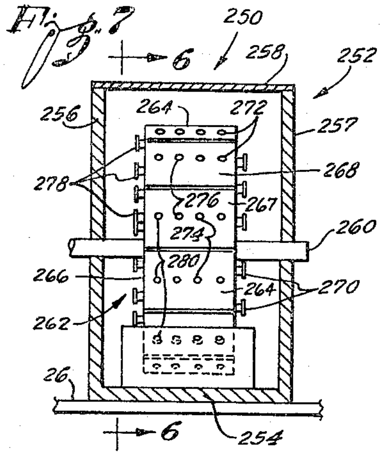
FIGURE 7 is a transverse cross-sectional view taken substantially along the line of 7—7 in FIGURE 6.

As an alternative, the UHF tuner may be similar to the embodiment shown in FIGURES 6 and 7. More particularly, this tuner 250 includes a frame 252 that is similar to the frame 136 in the tuner 20. This frame 252 has a base 254 that may be secured to the chassis 26 adjacent to the motor means 116. A pair of end members 256–257 may be provided on the opposite ends of the base 254 so as to project therefrom substantially normal to the surface of the chassis 26. A generally U-shaped cover 258 may be provided which will fit over the end members 256 so as to be frictionally retained thereon and form an enclosed space.

Each of the end members 256 may include an opening which is adapted to form a bearing for supporting a shaft 260. These openings are preferably aligned with each other and with the shafts 34 and 128 so that the shaft 260 will be substantially coaxial. One end of the shaft 260 may be positioned adjacent the end wall 257 while the opposite end projects forwardly from the end wall 256 so as to terminate adjacent the end of the shaft 128. The flexible coupling 148 may then interconnect the two shafts 128 and 260 so that they will both rotate in unison. It may thus be seen that an operator desiring to adjust the receiver 10 may turn the channel selector knob 40 on the front control panel 38 and simultaneously rotate the shaft 34 in the VHF tuner 18, the shaft 128 in the remote control unit, and the shaft 256 in the VHF tuner 250, or alternatively, the operator can employ the transmitter 84 to transmit a command signal that will cause the remote control receiver to actuate the motor 116 so as to rotatably drive the shafts 34 and 256 in the VHF tuner 18 and UHF tuner 20, respectively.

A plurality of tuning means 262 may be mounted on the shaft in a substantially cylindrical configuration concentric with the shaft 260. These tuning means 262 may be secured to the shaft so that they will rotate therewith. These tuning means 262 may be similar to the tuning means 194 in the first tuner in that they include a separate housing 264 for each tuning means 262. All of the housings 264 are substantially identical to each other and have a generally triangular transverse cross section. Each housing 264 includes a pair of triangular end walls 266–267, a generally rectangularly-shaped outer wall 268, and at least one rectangularly-shaped side wall 270. The inner end of the end wall 266 and one edge of the side wall form an apex which is adapted to fit against the exterior of the shaft and be secured thereto by any suitable means. The side wall 270 of each housing may fit against a side wall 270 on an adjacent housing while the outer walls 268 will form a substantially cylindrical surface.

The interior of each of the housings 264 includes an oscillator portion, a mixer portion, and an antenna portion. The oscillator portion may be disposed adjacent the end wall 267 and separated from the remaining portions by means of a suitable electric and magnetic shield. A capacitance and inductance may be disposed in the oscillator portion and connected in series with each other to form a series resonant circuit adapted to form at least a portion of a tank circuit for controlling the frequency of the oscillator 152. One end of this resonant circuit may be grounded to the housing 264, while the other end is connected to a contact 272 that extends through the outer wall 268. The capacitance may be mounted on the end wall 267 and include a tuning screw 270 which projects from the end wall 267. The capacitance in the resonant circuit may be varied by turning the screw to set the resonant frequency of the circuit at any desired amount.

The antenna portion may include one or more antenna coils. These coils may be disposed in the antenna portion of the housing 264 so as to be electrically interconnected with a pair of contacts 274 and 276 that project from the outer wall 268. In addition, bandpass filter means may be provided in the housing 264 so as to be coupled to the antenna coils. This bandpass filter means may include a pair of parallel resonant circuits, each of which includes an adjustable condenser. Each of these condensers may be mounted on the end wall 266 and have tuning screws 278 which project through the end wall 266. By adjusting one or both of these tuning screws 278, the frequencies and width of the filter's passband may be adjusted to include the desired number of channels. The bandpass filter may be operatively coupled into the antenna circuit so as to extract therefrom only those signals having frequencies within the passband.

The mixer portion may include a circuit which is coupled into the antenna circuit so as to extract therefrom one or more of the station signals present in the passband. Also, this circuit means may be coupled into the oscillator portion so as to receive the local oscillator signal. This mixer circuit means may be interconnected with an electrical contact 280 disposed on the outside of the housing.

An enclosure corresponding to the cylinder 150 may be mounted on the base 254 adjacent to the exterior of the cylindrical configuration formed by the tuning means 262. A plurality of electrical contacts may be provided on the exterior of the enclosure so as to engage the electrical contacts 272, 274, 276 and 280 on the exterior of one of the tuning means 262. Thus the elements inside of the housing 264 adjacent the enclosure will be interconnected with the oscillator 152, the mixer 180 and the antenna 14.

It may thus be seen that the UHF tuner 250 will operate simultaneous ly with the VHF tuner and select one of the UHF channels.

It will thus be seen that television tuning means have been provided which includes a very high frequency portion and an ultra high frequency portion and that these two portions are actuated in substantially identical manners. Thus it is now possible to employ a single control means of either the manual and/or the remote control varieties for tuning a television set in both the very high and ultra high frequency ranges.

While only a limited number of embodiments of the present invention have been disclosed, it will be readily apparent to those persons skilled in the art that numerous changes and modifications may be made thereto without departing from the spirit of the present invention. Accordingly, the accompanying drawings and description thereof are for illustrative purposes only and do not in any way limit the present invention which is defined only by the claims which follow;

What is claimed is:

1. A tuner for use in a television receiver for receiving preselected channels in a range of frequencies having a plurality of channels, said tuner comprising the combination of:

a separate housing for each of said preselected channels, each of said housings including tuning means having filter means for passing a band of frequencies that includes a group of channels containing one of said preselected channels and means tuned to select said preselected channel from said group, and means for mounting said housings in a cylindrical array having a passage through the center thereof for receiving means for being interconnected to any one of said tuning means to tune to one of said preselected channels.

2. A tuner for use in a television receiver for receiving preselected channels in a range of frequencies having a plurality of channels, said tuner comprising the combination of:

separate tuning means for each of said preselected channels, each of said tuning means being disposed in a separate housing and including a resonant circuit and a filter for passing a band of frequencies that includes a group of channels containing one of said preselected channels, means for mounting said housings in a substantially cylindrical array having a passage extending axially therethrough, a circuit at least partially disposed in said passage and including at least a portion of a local oscillator and a mixer, and means operatively interconnected with said circuit for rotating said circuit for operatively interconnecting said circuit with one of said tuning means.

3. In a television receiver for receiving signals in the very high frequency band and the ultra-high frequency band, the combination of:

a very high frequency tuner including a separate tuning means for each channel in said very high frequency band, an ultra-high frequency tuner having the same number of tuning means as said first tuner, each of the tuning means in said second tuner being positioned to correspond to the position of one of said tuning means in said first tuner and being tuned to select one channel from a group of channels in a predetermined frequency range, and remote control means interconnecting both of said tuners and responsive to a command signal for simultaneously indexing the tuning means in both of said sets into operative positions.

4. In a television receiver for receiving signals in the very high frequency band and for receiving signals in the ultra-high frequency band, the combination of:

a first tuner for the very high frequency range having tuning means, each of which is tuned to the frequency of one of the channels in said very high frequency band, a second tuner for the ultra-high frequency range having a separate tuning means for each of the tuning means in said first tuner, each of said separate tuning means including bandpass filter means tuned to pass a frequency range including a group of channels, each of said separate tuning means also including means tuned to select one station from said group, and remote control means operatively interconnected with both of said tuners and responsive to a command signal for simultaneouly selecting one tuning means in each tuner.

5. In a television receiver for receiving signals in the very high frequency range and the ultra high frequency range to select individual channels from a plurality in each of these ranges, the combination of:

a first tuner for the very high frequency range and having a first plurality of tuning means disposed in a substantially cylindrical array, each of said tuning means being tuned to select one of the channels in said very high frequency band, first means for providing a rotation of said first tuner into first preselected positions for operatively inter-connecting selected tuning means in the first tuner with said receiver, a second tuner for the ultra high frequency range and having a second plurality of separate tuning means each associated with a different one of the tuning means in said first tuner and being disposed in a substantially cylindrical array, each of said tuning means in the second plurality being tuned to pass a band of frequencies including an individual group of channels from an individual portion of the ultra high frequency range and having means tuned to select one channel from said group, second means for providing a rotation of said second tuner into second preselected positions aligned with said first preselected positions for operatively interconnecting selected tuning means in the second tuner with said receiver, and means operatively interconnected with said first and second means and responsive to a command signal from a remote position for simultaneously obtaining a rotation of said first and second tuners in accordance with said command signal.

6. In a tuner for use in a television receiver for receiving preselected ones of a plurality of channels in an ultra high range of frequencies, a plurality of separate tuning means each associated with a different one of said preselected channels, each of said tuning means including a filter portion and an oscillator portion, a local oscillator, said filter portion being effective to pass in the ultra high frequency range a band of frequencies that includes a group of channels containing an individual one of said preselected channels, said oscillator portion including means for tuning the local oscillator to a frequency that differs by a particular amount from the frequency of the preselected channel in said associated group of channels, means in said oscillator responsive to a control signal from a remote location for varying the frequency of said local oscillator, and means for obtaining a selection of individual ones of the tuning means in the plurality in accordance with the production of a second control signal.

7. In a tuner for use in a television receiver for receiving preselected ones of a plurality of channels in an ultra high range of frequencies, a plurality of separate tunnig means each associated with a different one of said preselected channels, each of said tuning means including a filter portion and an oscillator portion, said filter portion being effective to pass in the ultra high frequency range a band of frequencies that includes a group of channels containing an individual one of said preselected channels, a local oscillator for being interconnected with said oscillator portion of each of said separate tuning means in the plurality, means in said oscillator for tuning said oscillator to a frequency that differs from the frequency of the preselected channel in said selected group by a particular value, said oscillator including a variable reactance responsive to a control signal for varying its reactance in response to said signal, said reactance being interconnected with said oscillator for controlling the frequency thereof, control means for applying the signal to said reactance, and means for obtaining a selection of individual ones of said separate tuning means in the plurality in accordance with the production of a second control signal.

References Cited

UNITED STATES PATENTS 2,773,987 12/1956 Feigl ------------ 325—459 X

OTHER REFERENCES

RCA Review, "A VHF–UHF Television Turret Tuner," vol. XIV, Issue No. 3, September 1953, pp. 318–340 (pages 322 and 332 relied on).

KATHLEEN H. CLAFFY, *Primary Examiner.*

DAVID REDINBAUGH, ROBERT H. ROSE, *Examiners.*

R. S. BELL, R. LINN, *Assistant Examiners.*